US011721280B2

(12) United States Patent
Chen

(10) Patent No.: US 11,721,280 B2
(45) Date of Patent: Aug. 8, 2023

(54) DISPLAY DEVICE AND ELECTRONIC EQUIPMENT

(71) Applicant: Wuhan China Star Optoelectronics Semiconductor Display Technology Co., Ltd., Hubei (CN)

(72) Inventor: Tao Chen, Hubei (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 164 days.

(21) Appl. No.: 17/274,805

(22) PCT Filed: Dec. 21, 2020

(86) PCT No.: PCT/CN2020/138027
§ 371 (c)(1),
(2) Date: Mar. 10, 2021

(87) PCT Pub. No.: WO2022/095243
PCT Pub. Date: May 12, 2022

(65) Prior Publication Data
US 2022/0310005 A1    Sep. 29, 2022

(30) Foreign Application Priority Data
Nov. 5, 2020   (CN) .......................... 202011225327.0

(51) Int. Cl.
*G09G 3/3225*   (2016.01)
*H01L 27/32*    (2006.01)
*H01L 51/52*    (2006.01)

(52) U.S. Cl.
CPC ....... *G09G 3/3225* (2013.01); *H01L 27/3276* (2013.01); *H01L 51/5281* (2013.01);
(Continued)

(58) Field of Classification Search
CPC . H01L 27/3276; H01L 27/32; H01L 51/5281; H01L 27/3216; G09G 3/3225;
(Continued)

(56) References Cited

U.S. PATENT DOCUMENTS 6,476,783 B2 * 11/2002 Matthies ............. H01L 27/3293
345/82
9,853,096 B1 * 12/2017 Choi ................... H01L 27/3276
(Continued)

FOREIGN PATENT DOCUMENTS

CN   107656397 A   2/2018
CN   108269502 A   7/2018
(Continued)

OTHER PUBLICATIONS

International Search Report in International application No. PCT/CN2020/138027, dated Jul. 26, 2021.
(Continued)

*Primary Examiner* — Vinh T Lam
(74) *Attorney, Agent, or Firm* — PV IP PC; Zhigang Ma; Wei Te Chung

(57) ABSTRACT

A display device and an electronic equipment provided by the present application make a reflectance of a transition display region close to a reflectance of a main display region by disposing a metal reflective portion in gaps between a plurality of second pixel driving circuits in the transition display region, preventing an obvious boundary from occurring between the main display region and the transition display region when they are in a screen-off state and are under a condition of being irradiated by strong light.

16 Claims, 8 Drawing Sheets

(52) U.S. Cl.
CPC .............. *G09G 2300/0426* (2013.01); *G09G 2300/0452* (2013.01); *G09G 2300/0861* (2013.01); *G09G 2310/08* (2013.01); *H01L 27/3216* (2013.01)

(58) Field of Classification Search
CPC ....... G09G 2310/08; G09G 2310/0251; G09G 2300/0861; G09G 2300/0452; G09G 3/3233; G09G 2300/842; G09G 2300/0426; G09G 2300/0819
See application file for complete search history.

(56) References Cited

U.S. PATENT DOCUMENTS

| | | | | |
|---|---|---|---|---|
| 10,224,385 | B2 * | 3/2019 | Li | G06F 1/1637 |
| 10,622,421 | B2 * | 4/2020 | Seok | H01L 51/5056 |
| 10,777,122 | B2 * | 9/2020 | Kim | G09G 3/30 |
| 10,825,873 | B2 * | 11/2020 | Oh | G06F 3/0412 |
| 11,024,695 | B2 * | 6/2021 | Liu | H01L 27/3265 |
| 11,075,256 | B2 * | 7/2021 | Yan | H01L 27/3272 |
| 11,099,413 | B2 * | 8/2021 | Aoki | H01L 51/0097 |
| 11,145,701 | B2 * | 10/2021 | Ohchi | G09F 9/30 |
| 11,329,110 | B2 * | 5/2022 | Ohta | H01L 51/5225 |
| 11,355,563 | B2 * | 6/2022 | Moon | H01L 27/3246 |
| 11,456,346 | B2 * | 9/2022 | Zhao | H01L 27/326 |
| 2015/0055066 | A1 | 2/2015 | Yang | |
| 2020/0127069 | A1 * | 4/2020 | Madigan | H01L 27/3276 |
| 2022/0005796 | A1 * | 1/2022 | Jang | H01L 27/124 |
| 2022/0013588 | A1 * | 1/2022 | Motoyama | H05B 33/12 |

FOREIGN PATENT DOCUMENTS

| | | | | |
|---|---|---|---|---|
| CN | 108376693 A | | 8/2018 | |
| CN | 108878451 A | | 11/2018 | |
| CN | 109192768 A | | 1/2019 | |
| CN | 110706649 A | * | 1/2020 | ........... G09G 3/3208 |
| CN | 110767680 A | | 2/2020 | |
| CN | 110783384 A | | 2/2020 | |
| CN | 110783385 A | | 2/2020 | |
| CN | 111028692 A | | 4/2020 | |
| CN | 111048559 A | | 4/2020 | |
| CN | 111048569 A | | 4/2020 | |
| CN | 111146362 A | | 5/2020 | |
| CN | 111293157 A | | 6/2020 | |
| CN | 111341820 A | | 6/2020 | |
| CN | 111402743 A | * | 7/2020 | ........... G06F 1/1637 |
| CN | 111640776 A | | 9/2020 | |
| CN | 111739917 A | | 10/2020 | |
| CN | 110783385 B | * | 11/2020 | ............... G09F 9/33 |
| CN | 112102783 A | * | 12/2020 | ........... G09G 3/3225 |
| CN | 112102783 A | | 12/2020 | |
| CN | 113764460 A | * | 12/2021 | ......... H01L 27/3218 |
| CN | 110706649 B | * | 2/2022 | ........... G09G 3/3208 |
| CN | 114373784 A | * | 4/2022 | |
| JP | 2007256540 A | | 10/2007 | |

OTHER PUBLICATIONS

Written Opinion of the International Search Authority in International application No. PCT/CN2020/138027, dated Jul. 26, 2021.
Chinese Office Action issued in corresponding Chinese Patent Application No. 202011225327.0 dated Dec. 28, 2020, pp. 1-6.

* cited by examiner

DISPLAY DEVICE AND ELECTRONIC EQUIPMENT

RELATED APPLICATIONS

This application is a National Phase of PCT Patent Application No. PCT/CN2020/138027 having International filing date of Dec. 21, 2020, which claims the benefit of priority of Chinese Patent Application No. 202011225327.0 filed on Nov. 5, 2020. The contents of the above applications are all incorporated by reference as if fully set forth herein in their entirety.

FIELD AND BACKGROUND OF THE INVENTION

The present application is related to the field of display technology, and specifically, to a display device and an electronic equipment.

As shown in FIG. 1, which is a schematic diagram of a traditional active-matrix organic light-emitting diode (AMOLED) display panel, the AMOLED display panel includes a normal display region A, a transition display region B, and a light-transmitting display region C. The transition display region B is positioned between the light-transmitting display region C and the normal display region A. The transition display region B is provided with a plurality of pixel driving circuits for driving display pixels in the light-transmitting display region C. The pixel driving circuits in the transition display region B for driving the display pixels in the light-transmitting display region C are electrically connected to the display pixels in the light-transmitting display region C through transparent wires. The pixel driving circuits corresponding to the display pixels in the light-transmitting display region C and corresponding metal signal lines are disposed in the light-transmitting display region C, so as to ensure reflectance of the light-transmitting display region C and allow the light-transmitting display region C to have dual functions of photographing and display. In addition, a plurality of display pixels arranged in an array and corresponding pixel driving circuits are disposed in the normal display region A to achieve display. However, when the AMOLED display panel is in a screen-off state and is under a condition that strong light irradiates the AMOLED display panel, an obvious boundary occurs between the transition display region and the normal display region.

Therefore, it is necessary to propose a technical solution to solve a problem of an obvious boundary occurring between the transition display region and the normal display region when a display panel is at the screen-off state and is irradiated by strong light.

SUMMARY OF THE INVENTION

A purpose of the present application is to provide a display device and an electronic equipment to solve a problem of an obvious boundary occurring between a transition display region and a normal display region when a display panel is in a screen-off state and is under a condition of being irradiated by strong light.

In order to solve the above purpose, the present application provides a display device. The display device includes a main display region, a light-transmitting display region, and a transition display region disposed between the main display region and the light-transmitting display region. The display device further includes:

a plurality of first display pixels disposed in the main display region;

a plurality of second display pixels disposed in the transition display region and the light-transmitting display region;

a plurality of first pixel driving circuits arranged in an array in the main display region and configured to drive the first display pixels;

a plurality of second pixel driving circuits disposed in the transition display region and configured to drive the second display pixels; and a metal reflective portion disposed in the transition display region and at least positioned in gaps between the second pixel driving circuits.

The present application further provides an electronic equipment. The electronic equipment includes the above display device and an image sensor. The image sensor corresponds to the light-transmitting display region of the display device.

Beneficial effects: the display device and the electronic equipment provided by the present application make a reflectance of the transition display region close to a reflectance of the main display region by disposing the metal reflective portion in the gaps between the second pixel driving circuits in the transition display region, preventing the obvious boundary from occurring between the main display region and the transition display region when they are in the screen-off state and are under the condition of being irradiated by strong light.

DESCRIPTION OF SPECIFIC EMBODIMENTS OF THE INVENTION

The technical solution of the present application embodiment will be clarified and completely described with reference accompanying drawings in embodiments of the present application embodiment. Obviously, the present application described parts of embodiments instead of all of the embodiments. Based on the embodiments of the present application, other embodiments which can be obtained by a skilled in the art without creative efforts fall into the protected scope of the of the present application.

The present application provides a display device 100. The display device 100 can be a liquid crystal display device or an organic light-emitting diode display device. Specifically, the display device 100 is an organic light-emitting diode display device.

Figure 1:
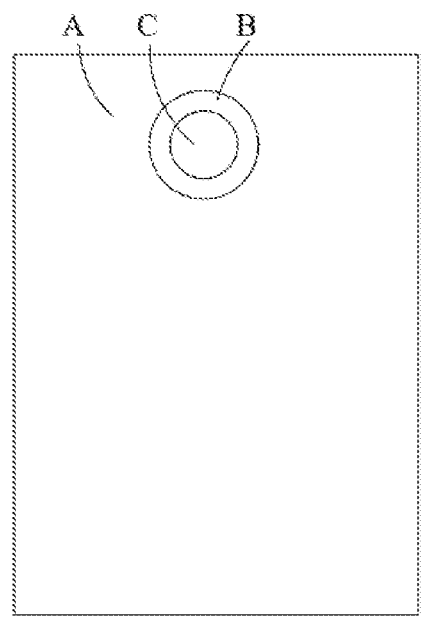
FIG. 1 is a schematic diagram of a traditional active-matrix organic light-emitting diode display panel.
Figure 2:
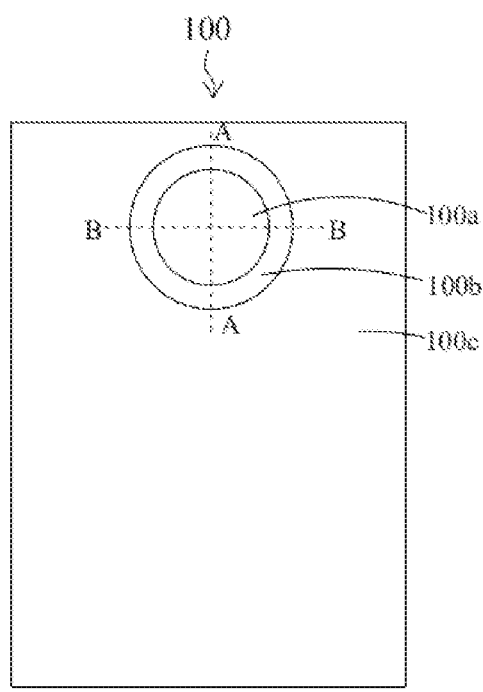
FIG. 2 is a schematic diagram of a plan view of a display device provided by an embodiment of the present application.
Figure 3:
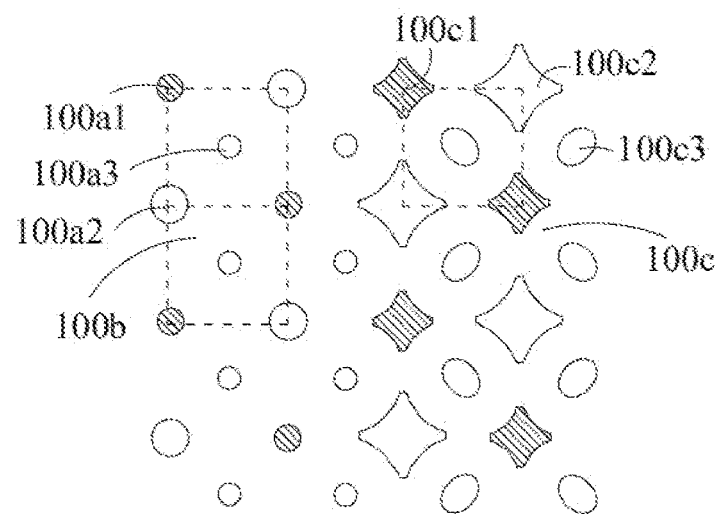
FIG. 3 is a schematic diagram of a distribution of first display pixels and second display pixels in the display device shown in FIG. 2.

Please refer to FIGS. 2 and 3. FIG. 2 is a schematic diagram of a plan view of the display device provided by an embodiment of the present application. FIG. 3 is a schematic diagram of a distribution of first display pixels and second display pixels in the display device shown in FIG. 2. The display device 100 includes a light-transmitting display region 100a, a main display region 100c, and a transition display region 100b. The display device 100 further includes a plurality of first display pixels, a plurality of first pixel driving circuits 104, a plurality of second display pixels, a plurality of pixel driving circuit islands 101, a plurality of first signal lines 102, a plurality of second signal lines 103, and a metal reflective portion 105.

The transition display region 100b is disposed between the light-transmitting display region 100a and the main display region 100c. The main display region 100c and the transition display region 100b are configured to display. When the light-transmitting display region 100a is configured to display, it also has a high light-transmitting characteristic. A light transmittance of the light-transmitting display region 100a is greater than light transmittances of the main display region 100c and the transition display region 100b. An area of the main display region 100c is greater than areas of the transition display region 100b and the light-transmitting display region 100a.

The light-transmitting display region 100a includes an arc-shaped boundary. The light-transmitting display region 100a is elliptical, circular, chamfered square, or other shaped. The transition display region 100b is ring-shaped. A shape of the transition display region 100b is any one of elliptical ring-shaped, circular ring-shaped, or square ring-shaped.

Specifically, the light-transmitting display region 100a is circular. The light-transmitting display region 100a is symmetrically arranged along a first symmetry axis A-A and a second symmetry axis B-B, and the first symmetry axis A-A is perpendicular to the second symmetry axis B-B. The transition display region 100b is ring-shaped. A boundary of the transition display region 100b adjacent to the light-transmitting region 100a is circular. A boundary of the transition display region 100b adjacent to the main display region 100c is stage-shaped.

As shown in FIG. 3, the first display pixels are evenly arranged in the main display region 100c. Each first display pixel includes a first red subpixel 100c1, a first green subpixel 100c3, and a first blue subpixel 100c2. The first red subpixel 100c1, the first green subpixel 100c3, and the first blue subpixel 100c2 are distributed in a PENTILE arrangement in the main display region 100c. The first green subpixel 100c3 is elliptical, and the first red subpixel 100c1 and the first blue subpixel 100c2 are octagonal. Each subpixel of the first display pixels includes an organic light-emitting diode OLED.

Figure 4:
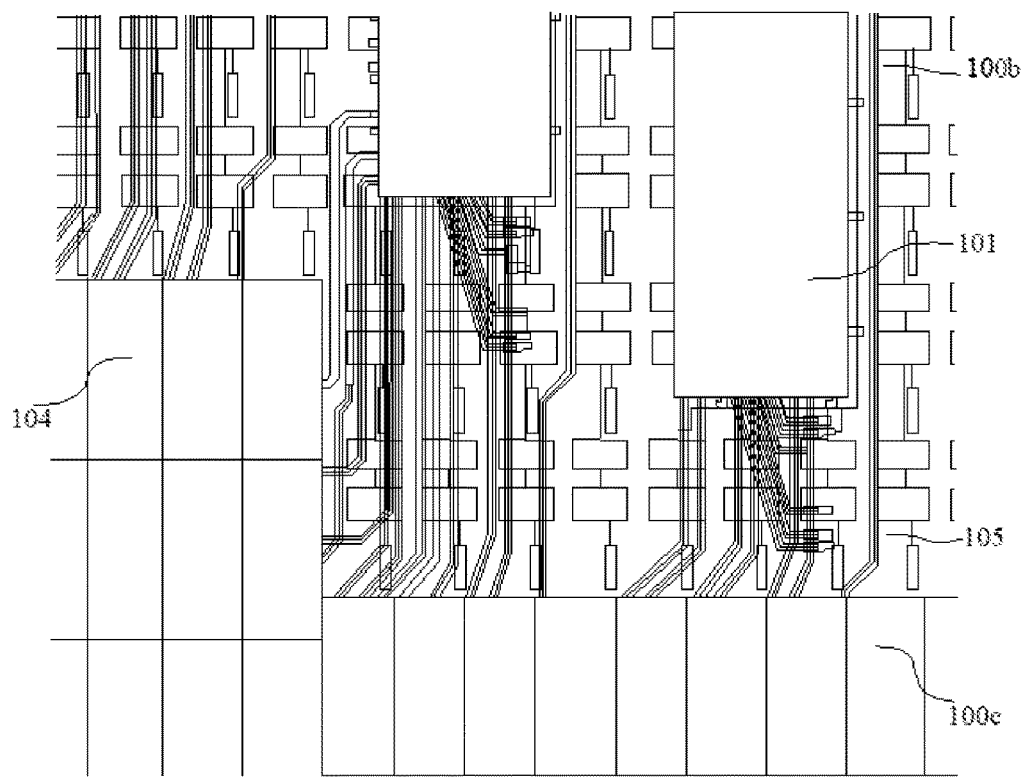
FIG. 4 is a partial enlarged schematic diagram of the display device shown in FIG. 2.

As shown in FIG. 4, FIG. 4 is a partial enlarged schematic diagram of the display device shown in FIG. 2, the first pixel driving circuits 104 are arranged in an array in the main display region 100c. One first pixel driving circuit 104 correspondingly drives one subpixel (one of the first red subpixel 100c1, the first green subpixel 100c3, or the first blue subpixel 100c2) of the main display region 100c to emit light. The first pixel driving circuits 104 are distributed in a stage shape at a junction between the main display region 100c and the transition display region 100b, so as to adapt to the subpixels of the first display pixels at a junction between the main display region 100c and the transition display region 100b being distributed in a stage shape.

Figure 5:
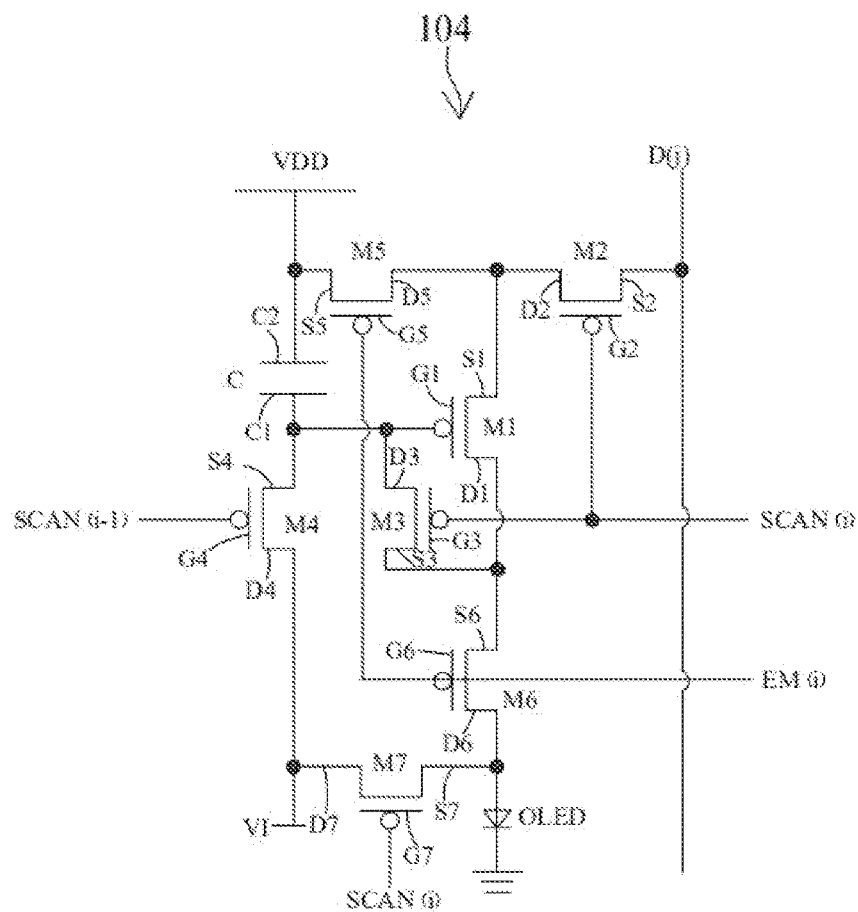
FIG. 5 is an equivalent circuit diagram of a first pixel driving circuit shown in FIG. 4.
Figure 6:
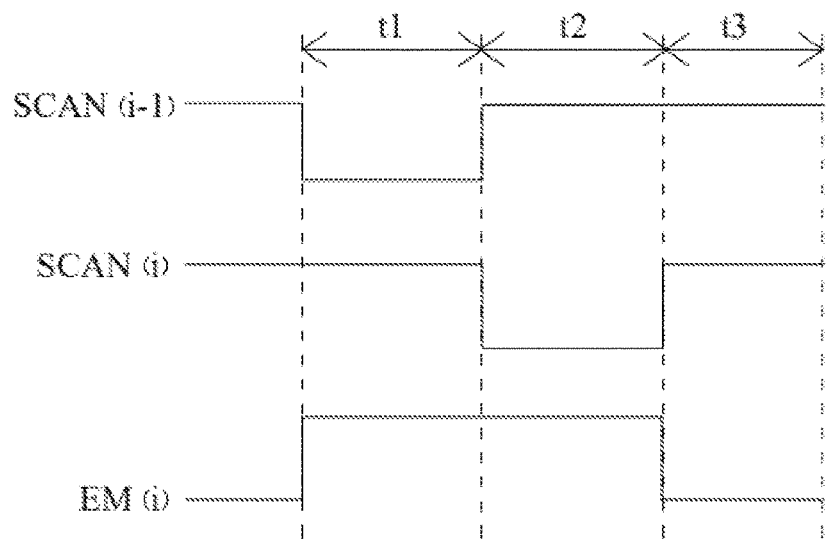
FIG. 6 is a driving timing diagram corresponding to the first pixel driving circuit.
Figure 7:
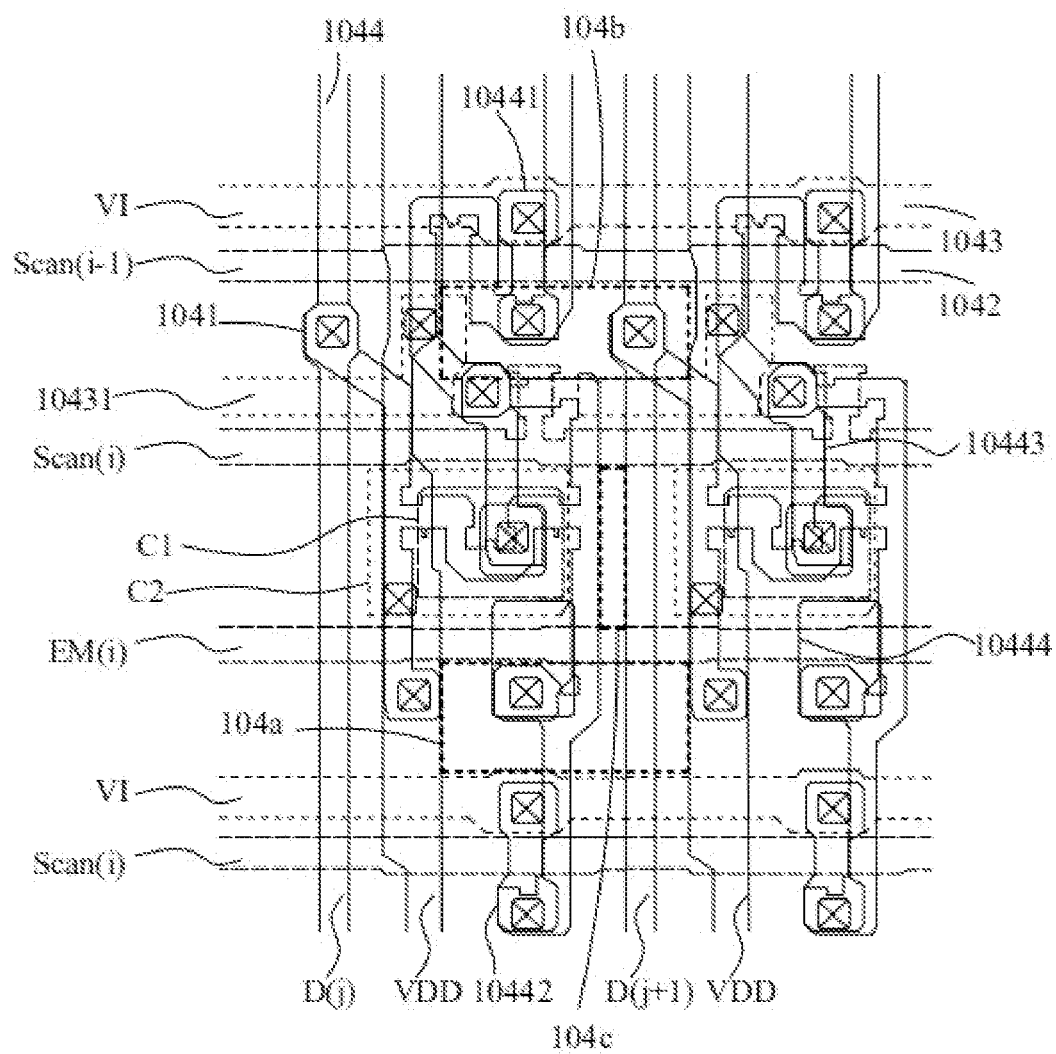
FIG. 7 is a schematic diagram of a plan view of two adjacent first pixel driving circuits.

Please refer to FIGS. 5 and 6. FIG. 5 is an equivalent circuit diagram of a first pixel driving circuit shown in FIG. 4. FIG. 6 is a driving timing diagram corresponding to the first pixel driving circuit. FIG. 7 is a schematic diagram of a plan view of two adjacent first pixel driving circuits. Each first pixel driving circuit includes a driving transistor M1, a switching transistor M2, a compensation transistor M3, an initialization transistor M4, a first light emission control transistor M5, a second light emission control transistor M6, an anode reset transistor M7, and a capacitor C. That is, the first pixel driving circuits 104 are 7T1C circuits. The driving transistor M1, the switching transistor M2, the compensation transistor M3, the initialization transistor M4, the first light emission control transistor M5, the second light emission control transistor M6, and the anode reset transistor M7 are all P-type transistors.

The display device 100 further includes a plurality of traces electrically connected to the first pixel driving circuits 104. The traces include an (i−1)-th scan signal line SCAN(i−1) disposed in the main display region 100c, an i-th scan signal line SCAN(i), a data line D(j), a data line D(j+1), an initialization signal line VI, a direct current (DC) power signal line VDD, and an i-th light emission control signal line EM(i). The (i−1)-th scan signal line SCAN(i−1) is configured to transmit an (i−1)-th scan signal. The i-th scan signal line SCAN(i) is configured to transmit an i-th scan signal. The data line D(j) and the data line D(j+1) are configured to transmit data signals. The DC power signal line VDD is configured to transmit a DC power signal. The i-th light emission control signal line EM(i) is configured to transmit an i-th light emission control signal. A first pixel driving circuit 104 connected to the data line D(j) among two adjacent first pixel driving circuits 104 is described below with reference to FIGS. 5 and 6.

A gate G1 of the driving transistor M1 is connected to a first plate C1 of the capacitor C, a drain D3 of the compensation transistor M3, and a source S4 of the initialization transistor M4. A source S1 of the driving transistor M1 is connected to the DC power signal line VDD through the first light emission control transistor M5. The source S1 of the driving transistor M1 is connected to the data line D(j) through the switching transistor M2. A drain D1 of the driving transistor M1 is connected to the organic light-emitting diode OLED through the second light emission control transistor M6. When the switching transistor M2 is turned on, the driving transistor M1 receives a data signal transmitted by the data line D(j) and provides a driving current for the organic light-emitting diode OLED.

A gate G2 of the switching transistor M2 is connected to the i-th scan signal line SCAN(i). A source S2 of the switching transistor M2 is connected to the data line D(j). A drain D2 of the switching transistor M2 is connected to the source S1 of the driving transistor M1. The drain D2 of the switching transistor M2 is further connected to the DC power signal line VDD through the first light emission control transistor M5. The switching transistor M2 is turned on or off according to the i-th scan signal transmitted by the i-th scan signal line SCAN(i) to control whether the data signal transmitted by the data line D(j) is written to the source S1 of the driving transistor M1.

A gate G3 of the compensation transistor M3 is connected to the i-th scan signal line SCAN(i). A source S3 of the compensation transistor M3 is connected to the drain D1 of the driving transistor M1. The source S3 of the compensation transistor M3 is further connected to the organic light-emitting diode OLED through the second light emission control transistor M6. The drain D3 of the compensation transistor M3 is connected to the gate G1 of the driving transistor M1, the source S4 of the initialization transistor M4, and the first plate C1 of the capacitor C. The compensation transistor M3 is turned on or off according to the i-th scan signal transmitted by the i-th scan signal line SCAN(i) to electrically connect the gate G1 of the driving transistor M1 and the drain D1 of the driving transistor M1.

A gate G4 of the initialization transistor M4 is connected to the (i−1)-th scan signal line SCAN(i−1). A drain D4 of the initialization transistor M4 is connected to a drain D7 of the anode reset transistor M7 and the initialization signal line VI. The source S4 of the initialization transistor M4 is connected to the gate G1 of the driving transistor M1, the drain D3 of the compensation transistor M3, and the first plate C1 of the capacitor C. The initialization transistor M4 is turned on or off according to the (i−1)-th scan signal transmitted by the (i−1)-th scan signal line SCAN(i−1) to control whether the initialization signal transmitted by the initialization signal line VI is written to the gate G1 of the driving transistor M1.

A gate G5 of the first light emission control transistor M5 is connected to the i-th light emission control signal line EM(i). A source S5 of the first light emission control transistor M5 is connected to the DC power signal line VDD and a second plate C2 of the capacitor C. A drain D5 of the first light emission control transistor M5 is connected to the source S1 of the driving transistor M1 and the drain D2 of the switching transistor M2. The first light emission control transistor M5 is turned on or off according to the i-th light emission control signal transmitted by the i-th light emission control signal line EM(i) to control whether the DC power signal transmitted by the DC power signal line VDD is written to the source S1 of the driving transistor M1.

A gate G6 of the second light emission control transistor M6 is connected to the i-th light emission control signal line EM(i). A source S6 of the second light emission control transistor M6 is connected to the drain D1 of the driving transistor M1 and the source S3 of the compensation transistor M3. A drain D6 of the second light emission control transistor M6 is connected to an anode of the organic light-emitting diode OLED and a source S7 of the anode reset transistor M7. The second light emission control transistor M6 is turned on or off according to the i-th light emission control signal transmitted by the i-th light emission control signal line EM(i) to control whether the driving current flows into the organic light-emitting diode OLED.

A gate G7 of the anode reset transistor M7 is connected to the i-th scan signal line SCAN(i). The drain D7 of the anode reset transistor M7 is connected to the drain D4 of the initialization transistor M4 and the initialization signal line VI. The source S7 of the anode reset transistor M7 is connected to the anode of the organic light-emitting diode OLED and the drain D6 of the second light emission control transistor M6. The anode reset transistor M7 is turned on or off according to the i-th scan signal transmitted by the i-th scan signal line SCAN(i) to control whether the initialization signal transmitted by the initialization signal line VI is written to the anode of the organic light-emitting diode OLED.

The first plate C1 of the capacitor C is connected to the gate G1 of the driving transistor M1, the source S4 of the initialization transistor M4, and the drain D3 of the compensation transistor M3. The second plate C2 of the capacitor C is connected to the DC power signal line VDD and the source S5 of the first light emission control transistor M5. The capacitor C is configured to maintain a voltage of the gate of the driving transistor M1 when the driving transistor M1 drives the organic light-emitting diode OLED to emit light.

With reference to FIG. 6, in an initialization phase t1, the (i−1)-th scan signal line SCAN(i−1) inputs a low level (i−1)-th scan signal, the initialization transistor M4 is turned on, and the initialization signal transmitted by the initialization signal line VI is transmitted to the gate G1 of the driving transistor M1, so as to realize initialization of the gate G1 of the driving transistor M1; the i-th scan signal line SCAN(i) inputs a high level i-th scan signal, and the switching transistor M2, the compensation transistor M3 and the anode reset transistor M7 are all turned off; the i-th light emission control signal line EM(i) inputs a high level i-th light emission control signal, and the first light emission control transistor M5 and the second light emission control transistor M6 are turned off.

In a threshold voltage compensation and a data voltage writing phase t2, the (i−1)-th scan signal line SCAN(i−1) inputs a high level (i−1)-th scan signal, and the initialization transistor M4 is turned off; the i-th scan signal line SCAN(i) inputs a low level i-th scan signal, and the switching transistor M2, the compensation transistor M3, and the anode reset transistor M7 are all turned on; a turned-on compensation transistor M3 electrically connects the gate G1 of the driving transistor M1 and the drain D1 of the driving transistor M1, a turned-on switching transistor M2 writes the data signal transmitted by the data line D(j) to the driving transistor M1, and a turned-on anode reset transistor M7 outputs the initialization signal transmitted by the initialization signal line VI to the anode of the organic light-emitting diode OLED, thus realizing compensation of the threshold voltage of the driving transistor M1, writing of the data signal, and initialization of the anode of the organic light-emitting diode OLED; the i-th light emission control signal line EM(i) inputs a high level i-th light emission control signal, and the first light emission control transistor M5 and the second light emission control transistor M6 are turned off.

In a light-emitting phase t3, the (i−1)-th scan signal line SCAN(i−1) inputs a high level (i−1)-th scan signal, and the initialization transistor M4 is turned off; the i-th scan signal line SCAN(i) inputs a high level i-th scan signal, and the switching transistor M2, the compensation transistor M3, and the anode reset transistor M7 are all turned off; the i-th light emission control signal line EM(i) inputs a low level i-th light emission control signal, the first light emission control transistor M5 and the second light emission control transistor M6 are turned on, the driving transistor M1 is turned on and outputs a driving current, and the organic light-emitting diode OLED emits light.

With reference to FIG. 7, the display device includes a patterned active layer 1041, a patterned first metal layer 1042, a patterned second metal layer 1043, and a patterned third metal layer 1044. The patterned first metal layer 1042 is disposed on a side of the patterned active layer 1041. The patterned second metal layer 1043 is disposed on a side of the patterned first metal layer 1042 away from the patterned active layer 1041. The patterned third metal layer 1044 is disposed on a side of the patterned second metal layer 1043 away from the patterned first metal layer 1042. A first insulating layer is provided between the patterned active layer 1041 and the patterned first metal layer 1042. A second insulating layer is provided between the patterned first metal layer 1042 and the patterned second metal layer 1043. A third insulating layer is provided between the patterned second metal layer 1043 and the patterned third metal layer 1044. Materials for the patterned first metal layer 1042, the patterned second metal layer 1043, and the patterned third metal layer 1044 include, but is not limited to, at least one of molybdenum, aluminum, titanium, or copper. The patterned first metal layer 1042, the patterned second metal layer 1043, and the patterned third metal layer 1044 can all reflect light. The first insulating layer, the second insulating layer, and the third insulating layer are all inorganic insulating layers, and material of the inorganic insulating layer is selected from at least one of silicon oxide or silicon nitride.

The patterned active layer 1041 includes channels, sources, and drains of seven transistors of the first pixel driving circuit 104. The patterned first metal layer 1042 includes the i-th scan signal line SCAN(i), the (i−1)-th scan signal line SCAN(i−1), the i-th light emission control signal line EM(i), and the first plate C1 (the gate of the driving transistor M1) of the capacitor C. The patterned second metal layer 1043 includes the initialization signal line VI, a metal shielding member 10431, and the second plate C2 of the capacitor C. The metal shielding member 10431 is electrically connected to the DC power signal line VDD to introduce the DC power signal. The patterned third metal layer 1044 includes the data line D(j), the data line D(j+1), the DC power signal line VDD, a first initialization lead 10441, a second initialization lead 10442, a gate lead 10443, and an anode lead 10444. The first initialization lead 10441 is connected between the initialization signal line VI and the drain of the initialization transistor M4. The second initialization lead 10442 is connected between the initialization signal line VI and the drain of the anode reset transistor M7. The gate lead 10443 is connected between the first plate C1 and the drain of the compensation transistor M3. The anode lead 10444 is connected between the anode of the organic light-emitting diode and the drain of the second light emission control transistor M6.

The first pixel driving circuits 104 are formed by stacking a metal layer with a high reflectance, an insulating layer with a low reflectance, and a semiconductor layer with a low reflectance. Metal in the first pixel driving circuits 104 is densely distributed in some regions and sparsely distributed in other regions, resulting in a presence of the high reflectance regions and the low reflectance regions in the first pixel driving circuits 104, and low reflectance regions of the first pixel driving circuits 104 have a lower reflectance than the high reflectance regions of the first pixel driving circuits 104. The first pixel driving circuits 104 include a plurality of low-reflectance stacking portions. A reflectance of the low-reflectance stacking portions of the first pixel driving circuits 104 is less than a reflectance of portions of the first pixel driving circuits 104 excluding the low-reflectance stacking portions. Each low-reflectance stacking portion is formed by stacking a plurality of film layers composing the first pixel driving circuit 104. A metal distribution density in the low-reflectance stacking portions is less than a metal distribution density in other portions of the first pixel driving circuits 104. Each low-reflectance stacking portion includes a blank stacking portion without metal. Each low-reflectance stacking portion can be a blank stacking portion without metal at all, or it can include a small amount of metal. A shape of an orthographic projection of the low-reflectance stacking portion on a substrate of the display device is rectangular, trapezoidal, or irregular-shaped.

Specifically, as shown in FIG. 7, the first pixel driving circuits 104 include a plurality of first low-reflectance stacking portions 104a, a plurality of second low-reflectance stacking portions 104b, and a plurality of third low-reflectance stacking portions 104c distributed in an array. The first low-reflectance stacking portions 104a, the second low-reflectance stacking portions 104b, and the third low-reflectance stacking portions 104c all include blank stacking portions. The blank stacking portions are positioned in a region where no metal film layers are provided, which means that an area of an orthographic projection of metal in the blank stacking portions on the substrate is equal to zero. Each first low-reflectance stacking portion 104a is a portion of two adjacent first pixel driving circuits 104 corresponding to a first region. The first region is surrounded by two adjacent DC power signal lines VDD, the i-th light emission control signal line EM(i), and the initialization signal line VI adjacent to the i-th light emission control signal line EM(i). The first low-reflectance stacking portion 104a includes part of the data line D(j+1). Each second low-reflectance stacking portion 104b is a portion of two adjacent first pixel driving circuits 104 corresponding to a second region. The second region is surrounded by two adjacent DC power signal lines VDD, the (i−1)-th scan signal line SCAN(i−1), the i-th scan signal line SCAN(i) adjacent to the (i−1)-th scan signal line SCAN(i−1), and metal shielding member 10431 positioned between the (i−1)-th scan signal line SCAN(i−1) and the i-th scan signal line SCAN(i). The second low-reflectance stacking portion 104b also includes a portion of the data line D(j+1). Each third low-reflectance stacking portion 104c is a portion of two adjacent first pixel driving circuits 104 corresponding to a third region. The third region is surrounded by the i-th light emission control signal line EM(i), the i-th scan signal line SCAN(i) adjacent to the i-th light emission control signal line EM(i), the data line D(j+1), and the patterned active layer 1041 adjacent to the data line D(j+1). The third low-reflectance stacking portion 104c does not include metal. The first low-reflectance stacking portion 104a, the second low-reflectance stacking portion 104b, and the third low-reflectance stacking portion 104c are all rectangular. Of two adjacent first pixel driving circuits 104, a third low-reflectance stacking portion 104c is disposed between a first low-reflectance stacking portion 104a and a second low-reflectance stacking portion 104b.

An area of an orthographic projection of the blank stacking portion in each first low-reflectance stacking portion 104a on the substrate of the display device is greater than an area of an orthographic projection of the blank stacking portion in each second low-reflectance stacking portion 104b on the substrate. The area of the orthographic projection of the blank stacking portion in each second low-reflectance stacking portion 104b on the substrate is greater than an area of an orthographic projection of the blank stacking portion in each third low-reflectance stacking portion 104c on the substrate. In the main display region 100c, except for a low reflectance of the blank stacking portions of the first low-reflectance stacking portions 104a, the blank stacking portions of the second low-reflectance stacking portions 104b, and the blank stacking portions of the third low-reflectance stacking portions 104c, a reflectance of other regions is high due to a distribution of metal layers.

With reference to FIGS. 2 and 3, the plurality of second display pixels are evenly arranged in the light-transmitting display region 100a and the transition display region 100b. Each second display pixel includes a second red subpixel 100a1, a second green subpixel 100a3, and a second blue subpixel 100a2. The second red subpixel 100a1, the second green subpixel 100a3, and the second blue subpixel 100a2 are distributed in a PENTILE arrangement in the light-transmitting display region 100a and the transition display region 100b. The second red subpixel 100a1, the second green subpixel 100a3, and the second blue subpixel 100a2 are circular. Each second red subpixel 100a1, second green subpixel 100a3, and second blue subpixel 100a2 includes an organic light-emitting diode OLED.

A size of the first red subpixel 100c1 is greater than a size of the second red subpixel 100a1, and a size of the first green subpixel 100c3 is greater than a size of the second green subpixel 100a3, and a size of the first blue subpixel 100c2 is greater than a size of the second blue subpixel 100a2, so as to ensure that the light-transmitting display region 100a has a high light transmittance. Because the sizes of a second red subpixel 100a1 and the first red subpixel 100c1 are different, driving powers of driving circuits corresponding to the two are also different. Similarly, driving powers of driving circuits corresponding to the first green subpixel 100c3 and the second green subpixel 100a3 are also different, and driving powers of driving circuits corresponding to the first blue subpixel 100c2 and the second blue subpixel 100a2 are also different. Therefore, the first pixel driving circuit 104 can only be configured to drive the first red subpixel 100c1, the first green subpixel 100c3, and the first blue subpixel 100c2 of the main display region 100c and cannot be configured to drive the transition display region 100b and the second red subpixel 100a1, the second green subpixel 100a3, and the second blue subpixel 100a2 of the light-transmitting region 100a.

From the main display region 100c to the transition display region 100b, sizes of subpixels become smaller. In order to display a uniform transition from the main display region 100c to the transition display region 100b and to prevent an obvious dividing line at the junction between the main display region 100c and the transition display region 100b during display, the first red subpixels 100c1, the first green subpixels 100c3, and the first blue subpixels 100c2 are distributed in a stage shape at the junction of the main display region 100c and the transition display region 100b. Furthermore, the second red subpixels 100a1, the second green subpixels 100a3, and the second blue subpixels 100a2 are distributed in a stage shape at the junction of the main display region 100c and the transition display region 100b.

Figure 8:
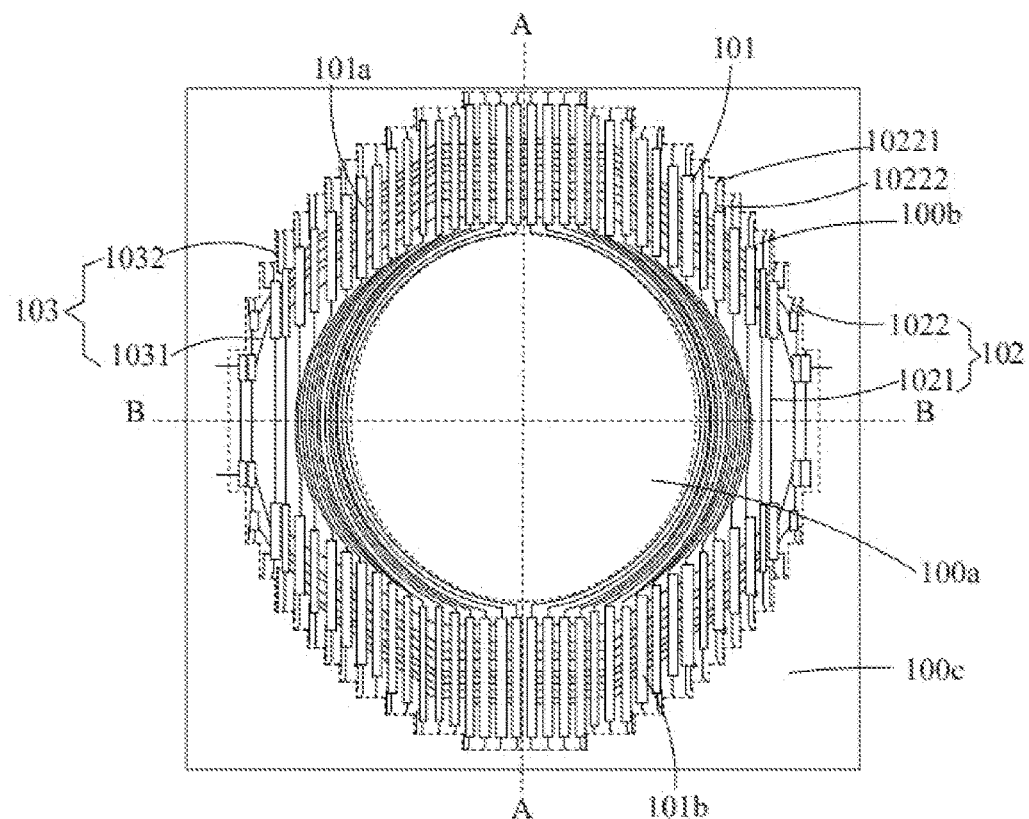
FIG. 8 is a partial enlarged schematic diagram of a main display region, a transition display region, and a light-transmitting display region of the display device shown in FIG. 2
Figure 9:
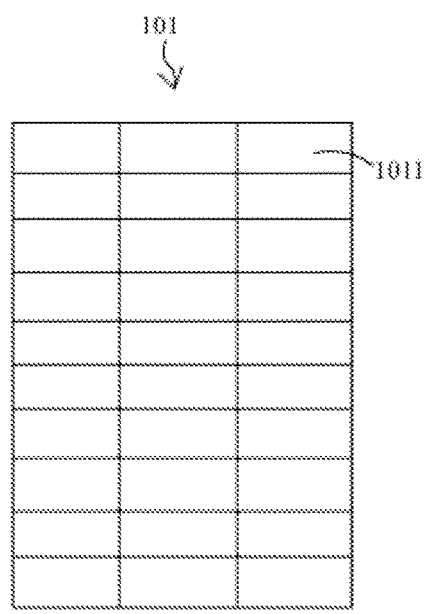
FIG. 9 is a schematic diagram of pixel driving circuit islands shown in FIG. 8.
Figure 10:
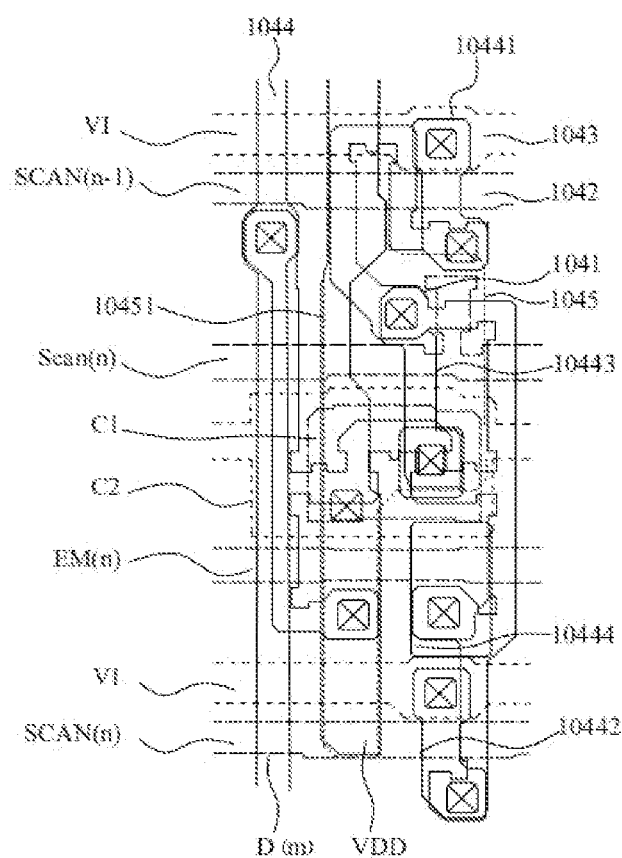
FIG. 10 is a schematic diagram of a plan view of second pixel driving circuits and a patterned fourth metal layer on the second pixel driving circuits.

Please refer to FIG. 8. FIG. 8 is a partial enlarged schematic diagram of the main display region, the transition display region, and the light-transmitting display region of the display device shown in FIG. 2. FIG. 9 is a schematic diagram of the pixel driving circuit islands shown in FIG. 8. FIG. 10 is a schematic diagram of a plan view of the second pixel driving circuits in the pixel driving circuit islands.

With reference to FIGS. 4, 8, and 9, it can be known that the second pixel driving circuits 1011 are disposed in the transition display region 100b, and the second pixel driving circuits 1011 composes the pixel driving circuit islands 101. The pixel driving circuit islands 101 surround the light-transmitting display region 100a, so that the pixel driving circuit islands 101 adapt to a shape of the light-transmitting display region 100a. A space between the second pixel driving circuits 1011 and the corresponding subpixels in the pixel driving circuit islands 101 is reduced, thereby reducing an impedance of wires connecting the second pixel driving circuits 1011 and the corresponding subpixels and increasing light emission uniformity of the second display pixels.

Specifically, the pixel driving circuit islands 101 include a first group pixel driving circuit islands 101a and a second group pixel driving circuit islands 101b. The pixel driving circuit islands 101 in the first group pixel driving circuit islands 101a are distributed in an arc shape. The pixel driving circuit islands 101 in the second group pixel driving circuit islands 101b are distributed in an arc shape. The pixel driving circuit islands 101 in the first group pixel driving circuit islands 101a and the pixel driving circuit islands 101 in the second group pixel driving circuit islands 101b are symmetrically arranged along the second symmetry axis B-B. The pixel driving circuit islands 101 in the first group pixel driving circuit islands 101a are symmetrically arranged along the first symmetry axis A-A. The pixel driving circuit islands 101 in the second group pixel driving circuit islands 101b are symmetrically arranged along the first symmetry axis A-A.

Each pixel driving circuit island 101 is rectangular. Each pixel driving circuit island 101 includes the second pixel driving circuits 1011 arranged in an array. The second pixel driving circuits 1011 of the pixel driving circuit islands 101 are configured to drive the second display pixels to emit light. The second pixel driving circuits 1011 of the pixel driving circuit islands 101 are configured to drive the second display pixels of the transition display region 100b to emit light, and meanwhile, to drive the second display pixels of the light-transmitting display region 100a to emit light. This prevents the light-transmitting display region 100a from being provided with the pixel driving circuits and also prevents the metal film layers of the second pixel driving circuits 1011 from affecting the light transmittance of the light-transmitting display region 100a, thereby further increasing the light transmittance of the light-transmitting display region 100a.

An equivalent circuit diagram of each second pixel driving circuit 1011 is same as an equivalent circuit diagram of the first pixel driving circuit shown in FIG. 5, but a driving power of the second pixel driving circuit 1011 is different from a driving power of the first pixel driving circuit 104. Correspondingly, differences between the second pixel driving circuit 1011 and the first pixel driving circuit 104 include a difference in size of the two, and a difference in sizes of internal devices and wirings between the two.

Please refer to FIG. 10, which is a schematic diagram of a plan view of the second pixel driving circuits and a patterned fourth metal layer on the second pixel driving circuits. The plan view of each second pixel driving circuit is basically similar to a plan view of the first pixel driving circuits, but distribution spacings are different between the two. Differences between the second pixel driving circuit 1011 and the first pixel driving circuit 104 further include that the second pixel driving circuit 1011 is connected to an (n−1)-th scan signal line SCAN(n−1), an n-th scan signal line SCAN(n), and an n-th light emission control signal line EM(n). A position of the (n−1)-th scan signal line SCAN (n−1) in the second pixel driving circuit 1011 corresponds to a position of the (i−1)-th scan signal line SCAN(i−1) in the first pixel driving circuit 104. A position of the n-th scan signal line SCAN(n) in the second pixel driving circuit 1011 corresponds to a position of the i-th scan signal line SCAN(i) in the first pixel driving circuit 104. A position of the n-th light emission control signal line EM(n) in the second pixel driving circuit 1011 corresponds to a position of the i-th light emission control signal line EM(i) in the first pixel driving circuit 104.

With reference to FIG. 10, it can be known that the display device further includes a patterned fourth metal layer 1045. The patterned fourth metal layer 1045 is disposed on a side of the patterned third metal layer 1044 away from the patterned second metal layer 1043. A fourth insulating layer is provided between the patterned fourth metal layer 1045 and the patterned third metal layer 1044. The patterned fourth metal layer 1045 includes metal grids 10451. The metal grids 10451 are configured to transmit DC power signal. Part of the metal grids 10451 is disposed in the main display region 100c. Part of the metal grids 10451 corresponds to the second pixel driving circuits 1011 of the pixel driving circuit islands 101. The metal grids 10451 include a plurality of vertical metal lines and horizontal metal lines, and the metal grids 10451 are in a grid shape. The metal grids 10451 are electrically connected to the DC power signal line VDD in the patterned third metal layer 1044 to transmit the DC power signal and alleviate a resistance voltage drop during transmission of the DC power signal. Material of the patterned fourth metal layer 1045 includes at least one of molybdenum, aluminum, titanium, or copper. The fourth insulating layer is an organic insulating layer. The second pixel driving circuits 1011 in the pixel driving circuit islands 101 are electrically connected to the second display pixels in the light-transmitting display region 100a through transparent wires, so as to further increase the light transmittance of the light-transmitting display region 100a. Material of the transparent wires is selected from at least one of indium tin oxide or indium zinc oxide. The second pixel driving circuits 1011 in the pixel driving circuit islands 101 and the second display pixels in the transition display region 100b can be electrically connected through metal wires.

Unlike in the main display region 100c, one second pixel driving circuit 1011 is configured to drive at least two of the second red subpixels 100a1, the second green subpixels 100a3, or the second blue subpixels 100a2. A number of second pixel driving circuits 1011 is reduced, and a space occupied by the pixel driving circuit islands 101 is reduced, so that a size of the light-transmitting display region 100a can be increased, or the transition display region 100b can have more space. The second pixel driving circuits 1011 can be configured to drive subpixels in the second red subpixels 100a1, the second green subpixels 100a3, and the second blue subpixels 100a2 that emit same color light and/or emit different color lights. In the light-transmitting display region 100a, subpixels driven by a same second pixel driving circuit 1011 are electrically connected through the transparent wires.

Specifically, two adjacent second red subpixels 100a1 are driven by a same second pixel driving circuit 1011, two adjacent second blue subpixels 100a2 are driven by a same second pixel driving circuit 1011, and four adjacent second green subpixels 100a3 are driven by a same second pixel driving circuit 1011.

Please refer to FIG. 8, the first signal lines 102 extend from the main display region 100c to the transition display region 100b, the second signal lines 103 extend from the main display region 100c to the transition display region 100b, and the first signal lines 102 and the second signal lines 103 are not disposed in the light-transmitting display region 100a. Materials of the first signal lines 102 and the second signal lines 103 are all metals, which include but are not limited to molybdenum, aluminum, titanium, and copper. The first signal lines 102 and the second signal lines 103 are not disposed in the light-transmitting display region 100a, so that the light-transmitting display region 100a has a high light transmittance.

Specifically, the first signal lines 102 are data lines, such as the above-mentioned data lines D(n), etc., and the data lines are configured to transmit data signals. The second signal lines 103 are selected from at least one of scan lines, reset lines, or light emission control signal lines, such as the above-mentioned scan signal lines SCAN(n) and the initialization signal lines VI. The scan lines are configured to transmit scan signals, the reset lines are configured to transmit reset signals and/or initialization signals, and the light emission control signal lines are configured to transmit light emission control signals.

Each first signal line 102 includes a first connection section 1021. The first connection sections 1021 of the first signal lines 102 are connected to the pixel driving circuit islands 101, so that the data signals are transmitted to the second pixel driving circuits 1011 of the pixel driving circuit islands 101. The first connection sections 1021 of the first signal lines 102 are disposed between the pixel driving circuit islands 101 and the light-transmitting display region 100a. Compared with the first connection sections 1021 of the first signal lines 102 being disposed on a periphery or two opposite sides of the pixel driving circuit islands 101, the first connection sections 1021 of the first signal lines 102 are disposed between the pixel driving circuit islands 101 and the light-transmitting display region 100a, so that lengths of the first connection sections 1021 of the first signal lines 102 are reduced. Therefore, the lengths of the first connection sections 1021 of the first signal lines 102 can be prevented from being too long, which leads to a large impedance difference and in turn leads to a problem of uneven display of the subpixels in the main display region 100c.

Specifically, the first connection section 1021 of each first signal line 102 is connected between the pixel driving circuit island 101 in the first group pixel driving circuit island 101a and the corresponding pixel driving circuit island 101 in the second group pixel driving circuit island 101b. This allows data signals to be transmitted between the pixel driving circuit island 101 in the first group pixel driving circuit island 101a and the corresponding pixel driving circuit island 101 in the second group pixel driving circuit island 101b.

Each first signal line 102 further includes a first transition section 1022. The first transition sections 1022 of the first signal lines 102 are disposed between the pixel driving circuit islands 101 and the main display region 100c and are connected to the pixel driving circuit islands 101. In one aspect, the first transition sections 1022 of the first signal lines 102 are disposed between the pixel driving circuit islands 101 and the main display region 100c, and an arrangement of the first transition section 1022 of each first signal line 102 needs to occupy a space between the pixel driving circuit islands 101 and the main display region 100c to complete a transition of the first signal lines 102 from the main display region 100c to the transition display region 100b. On the other aspect, the pixel driving circuit islands

101 are disposed closer to a center of the light-transmitting display region 100*a* to ensure that the second pixel driving circuits 1011 in the pixel driving circuit islands 101 corresponding to the second display pixels of the center of the light-transmitting display region 100*a* can drive the second display pixels at the center.

At least part of the first transition section 1022 includes a sector section 10221 and a straight section 10222 connected to the sector section 10221. The sector sections 10221 of the first transition sections 1022 are gathered and distributed in a sector shape, narrowed into a group of the first signal lines 102, and connected to the pixel driving circuit islands 101 through the straight sections 10222 of the first transition sections 1022.

The second signal lines 103 extending to the transition display region 100*b* are divided into multiple groups. Each group is connected in series with corresponding pixel driving circuit islands 101 to transmit control signals (the scan signal, the light emission control signals, the initialization signals, the reset signals) to the pixel driving circuit islands 101 connected in series. Each second signal line 103 includes a second connection section 1031 connecting two adjacent pixel driving circuit islands 101 in the first group pixel driving circuit islands 101*a* and the second group pixel driving circuit islands 101*b*. The second connection section 1031 can be a straight line, a broken line, or arc shaped. Each second signal line 103 further includes a second transition section 1032. The second transition sections 1032 of the second signal lines 103 are disposed between the pixel driving circuit islands 101 and the main display region 100*c*. The second transition section 1032 is obtained by changing lines of the second signal line 103 of the main display region 100*c*.

In the transition display region 100*b*, because the second pixel driving circuits 1011 compose the pixel driving circuit islands 101, and each pixel driving circuit island 101 is electrically connected to at least two of the first signal lines 102 and is electrically connected to at least two of the second signal lines 103, the first signal lines 102 need to be adjusted when they extend to the transition display region 100*b* and are divided into groups of first signal lines 102. Each group of first signal lines 102 is connected to the pixel driving circuit island 101. The second signal lines 103 need to have their lines changed and be divided into multiple groups when they extend to the transition display region 100*b*. Each group of second signal lines 103 is connected in series with the pixel driving circuit islands 101.

Based on a lot of exploration and research, the inventor found that when the display device is in a screen-off state and is under a condition of being irradiated by strong light, there is an obvious boundary between the transition display region 100*b* and the main display region 100*c*. A reason is that metal coverage areas per unit area of the transition display region 100*b* and the main display region 100*c* are different, resulting in the transition display region 100*b* and the main display region 100*c* having different reflectance to light. The metal coverage area per unit area of the main display region 100*c* is relatively large, the metal coverage area per unit area of the transition display region 100*b* is relatively small, and a reason why the metal coverage area per unit area of the transition display region 100*b* is small is that because the metal covering area at gaps between the second pixel driving circuits 1011 is small. Specifically, in the transition display region 100*b*, a region outside the pixel driving circuit islands 101 has a low reflectance. Based on this, the present application provides the metal reflective portion 105 in the transition display region 100*b* of the display device. The metal reflective portion 105 is at least positioned in gaps between the second pixel driving circuits 1011. The reflectance at the gaps between the second pixel driving circuits 1011 is increased, so that the metal coverage area per unit area of the transition display region 100*b* and the main display region 100*c* are close, thereby bring the reflectance of the transition display region 100*b* and the main display region 100*c* are closer to prevent the obvious boundary from occurring between the main display region 100*c* and the transition display region 100*b* when the display device is in the screen-off state and is under the condition of being irradiated by strong light.

The metal reflective portion 105 can be part of or a combination of more of any one of the patterned first metal layer 1042, the patterned second metal layer 1043, the patterned third metal layer 1044, or the patterned fourth metal layer 1045. The metal reflective portion 105 can also be a newly added metal film layer in addition to the above-mentioned four patterned metal layers.

The metal reflective portion 105 transmits a DC voltage signal. The DC voltage signal is selected from one of the initialization signal or a power signal to prevent the metal reflective portion 105 from being in a floating state. The initialization signal is a signal transmitted by the above-mentioned initialization signal line VI. The power signal can be a DC power signal VDD, etc.

Specifically, the DC voltage signal is a power signal input to the first pixel driving circuits 104 and/or the second pixel driving circuits 1011.

Figure 12:
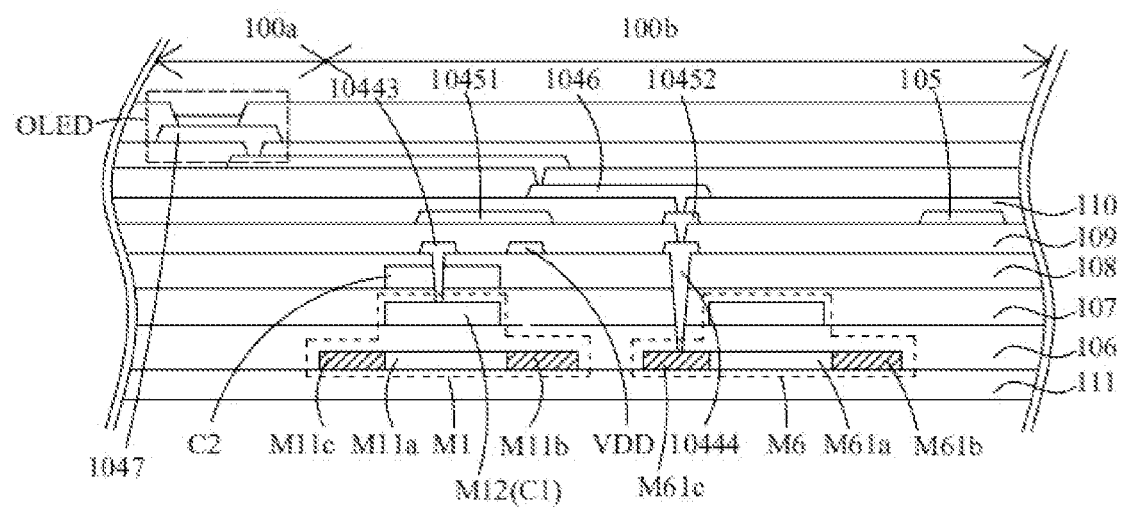
FIG. 12 is a first cross-sectional schematic diagram of the display device.
Figure 13:
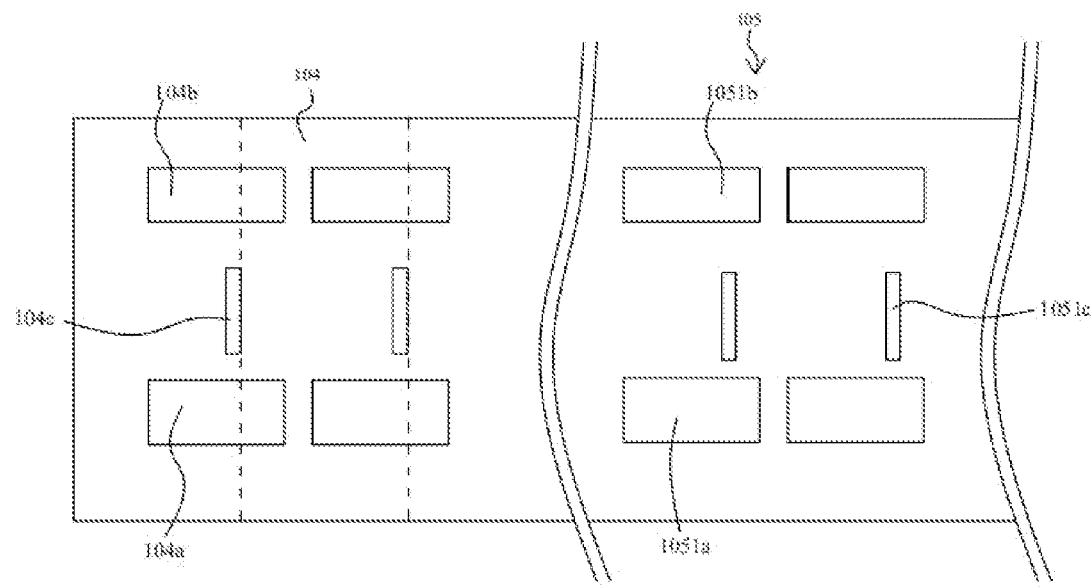
FIG. 13 is a schematic diagram shows positions of hollow portions in the metal reflective portion corresponding to part of the low-reflectance stacking portions in the first pixel driving circuits

Please refer to FIGS. 12 and 13. FIG. 12 is a first cross-sectional schematic diagram of the display device. FIG. 13 is a schematic diagram showing positions of hollow portions in the metal reflective portion corresponding to part of the low-reflectance stacking portions in the first pixel driving circuits. The display device includes the driving transistor M1, the second light emission control transistor M6, the capacitor, the gate lead 10443, the DC power signal line VDD, a first anode lead 10444, a second anode lead 10452, the metal grids 10451, and the metal reflective portion 105 disposed in the transition display region 100*b*. The display device further includes an organic light-emitting diode OLED disposed in the light-transmitting display region 100*a*.

The driving transistor M1 includes a driving active layer disposed on a substrate 111. The driving active layer is part of the above-mentioned patterned active layer 1041. The driving active layer includes a driving channel M11*a*, a driving source M11*b*, and a driving drain M11*c*. The driving source M11*b* and the driving drain M11*c* are obtained by conducting semiconductors after doping. The driving transistor M1 further includes a driving gate M12. The driving gate M12 corresponds to the driving channel M11*a*. The driving gate M12 is also a bottom plate C1 of the capacitor. The driving gate M12 is part of the above-mentioned patterned first metal layer 1042. A first insulating layer 106 is provided between the driving gate M12 and the driving active layer.

The second light emission control transistor M6 includes a second light emission control active layer and a second light emission control gate. The second light emission control active layer and the driving active layer are disposed in a same layer. The second light emission control active layer includes a second light emission control channel M61*a*, a second light emission control source M61*b*, and a second light emission control drain M61*c*. The second light emission control gate and the driving gate M12 are disposed in a same layer and disposed corresponding to the second light emission control channel M61a.

The capacitor includes the upper plate C2 and the lower plate C1. A second insulating layer 107 is disposed between the upper plate C2 and the lower plate C1, and the upper plate C2 corresponds to the lower plate C1. The upper plate C2 is part of the above-mentioned patterned second metal layer 1043.

The gate lead 10443 is positioned directly above the upper plate C2. The gate lead 10443 is part of the above-mentioned patterned third metal layer 1044. A third insulating layer 108 is disposed between the gate lead 10443 and the upper plate C2. The gate lead 10443 is electrically connected to the lower plate C1 through a through-hole penetrating the third insulating layer 108, the upper plate C2, and the second insulating layer 107, so as to be electrically connected to the driving gate M12 of the driving transistor M1.

The first anode lead 10444, the gate lead 10443, and the DC power supply signal line VDD are disposed in a same layer. The first anode lead 10444 is part of the above-mentioned patterned third metal layer 1044. The first anode lead 10444 and the second light emission control drain M61c of the second light emission control transistor M6 are electrically connected through a through-hole penetrating the third insulating layer 108, the second insulating layer 107, and the first insulating layer 106.

The second anode lead 10452 is part of the patterned fourth metal layer 1045. The second anode lead 10452 and the metal grids 10451 are disposed in a same layer. A fourth insulating layer 109 is disposed between the second anode lead 10452 and the first anode lead 10444. The second anode lead 10452 is electrically connected to the first anode lead 10444 through a through-hole on the fourth insulating layer 109.

A plurality of transparent wires 1046 are disposed above the second pixel driving circuits 1011. The transparent wires 1046 are connected between the second anode lead 10452 and the anode 1047 of the organic light-emitting diode OLED. Part of the transparent wires 1046 is arranged in the transition display region 100b. Part of the transparent wires 1046 extend from the transition display region 100b to the light-transmitting display region 100a, so that the second pixel driving circuit 1011 of the transition display region 100b drives subpixels of the light-transmitting display region 100a to increase the light transmittance of the light-transmitting display region 100a. A fifth insulating layer 110 is disposed between the transparent wires 1046 and the patterned fourth metal layer 1045. The fifth insulating layer 110 is an organic insulating layer. When the transparent wires 1046 are positioned in different film layers, the organic insulating layer is also provided between the transparent wires 1046 between adjacent film layers. A width of each transparent wire 1046 is greater than or equal to 1 micron. A distance between adjacent transparent wires 1046 of a same layer is greater than or equal to 2 microns to prevent short circuiting between the transparent wires 1046.

The metal reflective portion 105 and the metal grids 10451 are disposed in a same layer and connected to each other. The metal reflective portion 105 and the metal grids 10451 are obtained by a same patterning process. Because the patterned first metal layer 1042, the patterned second metal layer 1043, and the patterned third metal layer 1044 are mainly configured to arrange devices or traces of driving circuits, spaces in these film layers in which specific forms of metal reflectors can be provided is limited. There is enough space in the patterned fourth metal layer 1045 to arrange the metal reflective portion 105. Compared with configuring the first signal lines 102 and the second signal lines 103 of the transition display region 100b for reflection, configuring the metal reflective portion 105 of a same layer as the metal grids 10451 as a reflecting layer can reduce processes of removing part of the fourth metal layer, which is beneficial to simplifying processes. Moreover, an arrangement of the first signal lines 102 and the second signal lines 103 mainly considers signal transmission and reduction of impedance instead of reflection. Material of the metal reflective portion 105 includes at least one of molybdenum (Mo), aluminum (Al), titanium (Ti), or copper. For example, the metal reflective portion 105 can be formed as Ti layer/Al layer/Ti layer, and the metal reflective portion 105 can also be a Mo layer.

The metal grids 10451 are positioned above the DC power signal lines VDD. Because the metal grids 10451 are electrically connected to the DC power signal lines VDD, the metal reflective portion 105 is electrically connected to the DC power signal lines VDD. Therefore, the metal reflective portion 105 transmits the DC voltage signal to prevent the metal reflective portion 105 from floating without access to an electrical signal and affecting a circuit operation. Furthermore, the metal reflective portion 105 transmits the DC power signal to further alleviate the resistance voltage drop during the transmission of the DC power signal.

The metal reflective portion 105 includes at least a hollow portion, so that a reflectance of the hollow portion of the metal reflective portion 105 is low and a reflectance of other positions of the metal reflective portion 105 is high. The metal reflective portion 105 of the transition display region 100b and the first pixel driving circuits 104 of the main display region 100c both have a high reflectance area and a low reflectance area, which helps the two to have close to a same reflectance and alleviates the problem of the obvious boundary occurring on the display device in the screen-off state and under the condition of being irradiated by strong light. When the metal reflective portion 105 positioned in a same film layer, the hollow portion can be positioned in the same film layer. When the metal reflective portion 105 is positioned in a different film layer, the hollow portion can be positioned in one or more film layers.

The metal reflective portion 105 includes a plurality of hollow portions. Positions of the hollow portions in the metal reflective portion 105 correspond to positions of part of the low-reflectance stacking portions in the first pixel driving circuits 104, so that a reflectance distribution in the metal reflective portion 105 and a reflectance distribution in the first pixel driving circuits 104 tend to be same. The positions of the hollow portions in the metal reflective portion 105 corresponding to the positions of the part of the low-reflectance stacking portions in the first pixel driving circuits 104 means that the positions of the hollow portions in the metal reflective portion 105 are same as the positions of the part of the low-reflectance stacking portions in the first pixel driving circuits 104. The hollow portions and the part of the low-reflectance stacking portions can be arranged side by side as shown in FIG. 13, or the hollow portions and the part of the low-reflectance stacking portions can be staggered.

The hollow portion and the part of the low-reflectance stacking portions are arranged side by side, so that a position distribution of the hollow portion with a low reflectance in the metal reflective portion 105 and a position distribution of the low-reflectance stacking portions with a low reflectance in the first pixel driving circuits 104 tend to be same. A reflectance distribution of the metal reflective portion 105 and a reflectance distribution of the first pixel driving circuits 104 tend to be same, which further alleviates the problem of the obvious boundary occurring on the display device in the screen-off state and under the condition of being irradiated by strong light.

In the hollow portion and the low-reflectance stacking portion, which are arranged side by side, a shape of an orthographic projection of the low-reflectance stacking portion on the substrate 111 of the display device is same as or similar to a shape of an orthographic projection of the hollow portion on the substrate 111 of the display device, so that a reflectance of the metal reflective portion 105 and a reflectance of the first pixel driving circuits 104 close to same.

In the hollow portion and the low-reflectance stacking portion, which are arranged side by side, an area of the orthographic projection of the low-reflectance stacking portion on the substrate 111 of the display device is equal to an area of the orthographic projection of the hollow portion on the substrate 111 of the display device, so as to bring the reflectance of the metal reflective portion 105 and the reflectance of the first pixel driving circuits 104 closer to same.

The shape of an orthographic projection of the hollow portion on the substrate 111 of the display device includes at least one of rectangular, trapezoidal, or irregular-shaped. When the shape is regular-shaped such as rectangular and trapezoidal, it is easier to realize patterning in processes. When the shape is irregular-shaped, it is more conducive to matching the shape of the orthographic projection of the hollow portion on the substrate 111 of the display device with the shape of the orthographic projection of the low-reflectance stacking portion on the substrate 111.

In the hollow portions and the low-reflectance stacking portions, which are arranged side by side, a distance between two adjacent hollow portions is equal to a distance between two adjacent low-reflectance stacking portions.

Specifically, the hollow portion 105 includes a first hollow portion 1051a, a second hollow portion 1051b, and a third hollow portion 1051c arranged at intervals. An area of the first hollow portion 1051a is greater than an area of the second hollow portion 1051b. The area of the second hollow portion 1051b is greater than an area of the third hollow portion 1051c. The first low-reflectance stacking portion 104a and the first hollow portion 1051a are arranged side by side. The second low-reflectance stacking portion 104b and the second hollow portion 1051b are arranged side by side. The third low-reflectance stacking portion 104c and the third hollow portion 1051c are arranged side by side. Shapes of the first hollow portion 1051a, the second hollow portion 1051b, and the third hollow portion 1051c are all rectangular, which is beneficial to simplifying processes. Understandably, the shapes of the first hollow portion 1051a, the second hollow portion 1051b, and the third hollow portion 1051c can be adjusted according to shapes of the blank stacking portions of the first low-reflectance stacking portion 104a, the second low-reflectance stacking portion 104b, and the third low-reflectance stacking portion 104c. It should be explained that some metals in the first low-reflectance stacking portion 104a, the second low-reflectance stacking portion 104b, and the third low-reflectance stacking portion 104c in FIG. 13 are not shown. The actual first low-reflectance stacking portion 104a, the second low-reflectance stacking portion 104b, and the third low-reflectance stacking portion 104c are shown in FIG. 7.

The reflectance distribution of the metal reflective portion 105 is similar to a reflectance distribution of the main display region 100c by disposing the metal reflective portion 105 in a region of the transition display region 100b beyond the pixel driving circuit islands 101, which is beneficial to prevent an obvious difference of the reflectance distribution between the main display region 105 and the transition display region 100b from occurring.

Figure 11:
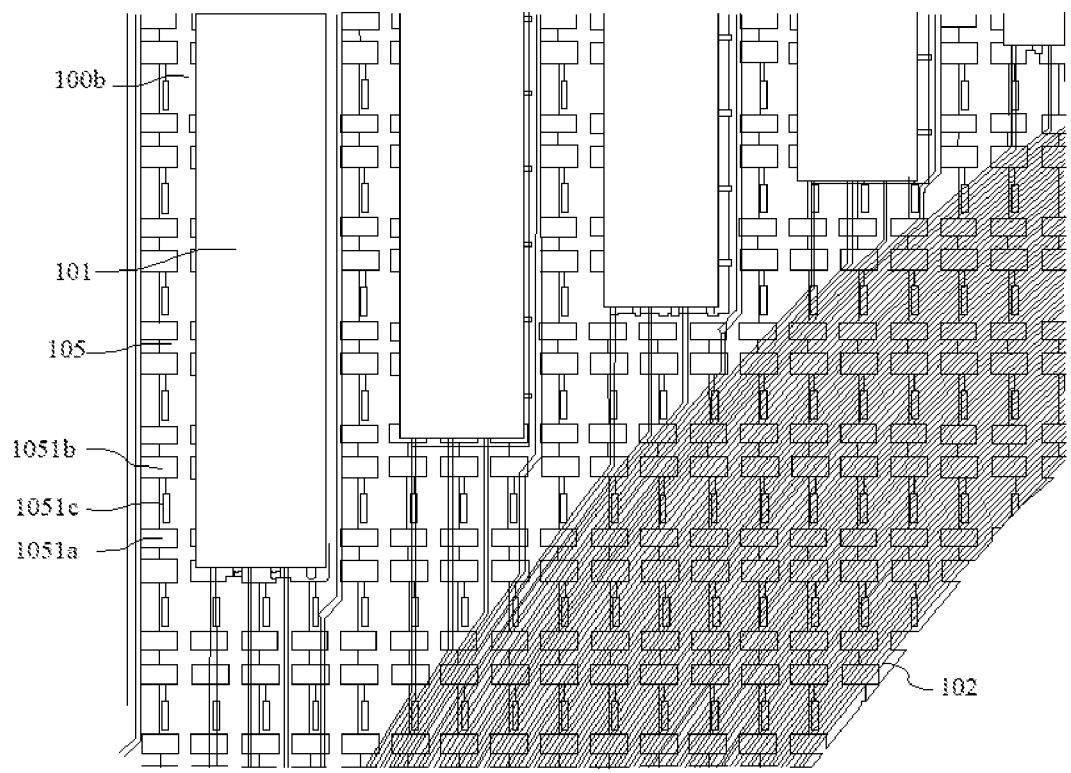
FIG. 11 is a partial enlarged schematic diagram of a metal reflective portion disposed in the transition display region of the display device.

It can be known with reference to FIGS. 4 and 11, part of the metal reflective portion 105 surrounds the pixel driving circuit islands 101 and is disposed between the pixel driving circuit islands 101 and the main display region 100c, part of the metal reflective portion 105 is arranged between the pixel driving circuit islands 101 and the light-transmitting display region 100a, and part of the metal reflective portion 105 is arranged between two adjacent pixel driving circuit islands 101. In this way, all regions of the transition display region 100b beyond regions where the pixel driving circuit islands 101 are provided are provided with the metal reflective portion 105.

A boundary of the metal reflective portion 105 adjacent to the light-transmitting display region 100a includes an arc-shaped boundary. A boundary of the metal reflective portion 105 adjacent to the main display region 100c includes a staged boundary. This can adapt to a circular boundary between the transition display region 100b and the light-transmitting region 100a and the staged boundary between the transition display region 100b and the main display region 100c, so that a reflectance at a junction matches a reflectance of other positions.

An absolute value of a difference between a proportion of an orthographic projection of metal in the metal reflective portion 105 on the substrate 111 of the display device in a unit area and a proportion of an orthographic projection of metal in the first pixel driving circuits 104 on the substrate 111 of the display device in a unit area is greater than or equal to 0% and less than or equal to 6%. Therefore, the reflectance of the metal reflective portion 105 of the transition display region 100b is close to the reflectance of the main display region 100c, which prevents the display device from experiencing the problem of the obvious boundary in the screen-off state and under the condition of being irradiated by strong light. The absolute value of the difference can be 1%, 2%, 3%, etc.

Figure 14:
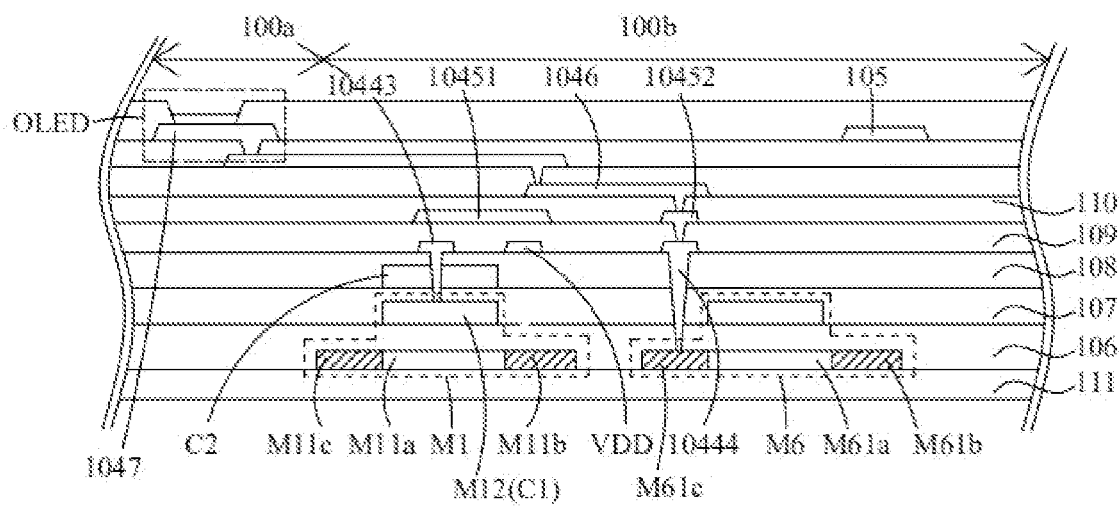
FIG. 14 is a second cross-sectional schematic diagram of the display device.

Please refer to FIG. 14, which is a second cross-sectional schematic diagram of the display device. The display device shown in FIG. 14 is similar to the display device shown in FIG. 12, except that the metal reflective portion 105 and the anode 1047 of the organic light-emitting diode OLED are arranged in a same layer. In addition, the metal reflective portion 105 is insulated from the anode 1047 of the organic light-emitting diode OLED, so that the reflectance of the transition display region 100b and the main display region 100c are close. The metal reflective portion 105 and the anode 1047 of the organic light-emitting diode OLED are obtained by patterning through a same process. The metal reflective portion 105 is a stack of an indium tin oxide layer, a silver layer, and an indium tin oxide layer. Compared with the metal reflective portion 105 disposed on the patterned fourth metal layer 1045 and connected to the DC power signal, the metal reflective portion 105 and the anode 1047 are arranged on a same layer and do not connect to a fixed voltage, which causes the metal reflective portion 105 to be in the floating state, increasing risks of the metal reflective portion 105 affecting a normal operation of circuits.

A distance between the metal reflective portion 105 and the anode 1047 of the organic light-emitting diode OLED is greater than or equal to 3 microns, so as to prevent short circuiting between anodes 1047 of organic light-emitting diodes OLED.

The present application further provides an electronic equipment. The electronic equipment includes the above-mentioned display device and an image sensor. The image sensor corresponds to the light-transmitting display region 100a of the display device. The image sensor is a camera. Because the light-transmitting display region 100a of the display device has a high light transmittance, a photographing effect of the camera can be ensured. Also, the light-transmitting display region 100a of the display device has the second display pixels, and the light-transmitting display region 100a can display. In addition, the display equipment id prevented from experiencing the problem of the obvious boundary in the screen-off state and under the condition of being irradiated by strong light by disposing the metal reflective portion 105 in the gaps between the second pixel driving circuits 1011 in the transition display region 100b.

The description of embodiments above is only for helping to understand technical solutions of the present application and its core idea. Understandably, for a person of ordinary skill in the art can make various modifications of the technical solutions of the embodiments of the present application above. However, it does not depart from the scope of the technical solutions of the embodiments of the present application.

What is claimed is:

1. A display device, comprising a main display region, a light-transmitting display region, and a transition display region disposed between the main display region and the light-transmitting display region;
    wherein the display device further comprises:
        a plurality of first display pixels disposed in the main display region;
        a plurality of second display pixels disposed in the transition display region and the light-transmitting display region;
        a plurality of first pixel driving circuits arranged in an array in the main display region and configured to drive the first display pixels;
        a plurality of second pixel driving circuits disposed in the transition display region and configured to drive the second display pixels; and
        a metal reflective portion disposed in the transition display region and at least positioned in gaps between the second pixel driving circuits.

2. The display device according to claim 1, wherein the metal reflective portion comprises at least a hollow portion, the first pixel driving circuits comprise a plurality of low-reflectance stacking portions, and at least one hollow portion is arranged side by side with part of the low-reflectance stacking portions.

3. The display device according to claim 1, wherein the metal reflective portion comprises a plurality of hollow portions, the first pixel driving circuits comprise a plurality of low-reflectance stacking portions, and positions of the hollow portions in the metal reflective portion correspond to positions of part of the low-reflectance stacking portions in the first pixel driving circuits.

4. The display device according to claim 2, wherein in the hollow portion and one of the low-reflectance stacking portions, which are arranged side by side, a shape of an orthographic projection of the one of the low-reflectance stacking portions on a substrate of the display device is same as or similar to a shape of an orthographic projection of the hollow portion on the substrate of the display device.

5. The display device according to claim 2, wherein in the hollow portion and one of the low-reflectance stacking portions, which are arranged side by side, an area of an orthographic projection of the hollow portion on a substrate of the display device is equal to an area of an orthographic projection of the one of the low-reflectance stacking portions on the substrate of the display device.

6. The display device according to claim 2, wherein a shape of an orthographic projection of the hollow portion on a substrate of the display device comprises at least one of rectangular, trapezoidal, or irregular-shaped.

7. The display device according to claim 2, wherein the hollow portion comprises a plurality of first hollow portions, a plurality of second hollow portions, and a plurality of third hollow portions arranged at intervals, an area of each of the first hollow portions is greater than an area of each of the second hollow portions, and the area of each of the second hollow portions is greater than an area of each of the third hollow portions;
    the low-reflectance stacking portion of the first pixel driving circuits comprises a plurality of first low-reflectance stacking portions, a plurality of second low-reflectance stacking portions, and a plurality of third low-reflectance stacking portions, an area of an orthographic projection of a blank stacking portion in each of the first low-reflectance stacking portions on a substrate of the display device is greater than an area of an orthographic projection of a blank stacking portion in each of the second low-reflectance stacking portions on the substrate of the display device, and the area of the orthographic projection of the blank stacking portion in each of the second low-reflectance stacking portions on the substrate of the display device is greater than an area of an orthographic projection of a blank stacking portion in each of the third low-reflectance stacking portions on the substrate of the display device; and
    the first hollow portions and the first low-reflectance stacking portions are arranged side by side, the second hollow portions and the second low-reflectance stacking portions are arranged side by side, the third hollow portions and the third low-reflectance stacking portions are arranged side by side, and an area of an orthographic projection of metal in the blank stacking portions on the substrate is equal to zero.

8. The display device according to claim 1, wherein the second pixel driving circuits compose a plurality of pixel driving circuit islands, the pixel driving circuit islands surround the light-transmitting display region, part of the metal reflective portion surrounds the pixel driving circuit islands and is disposed between the pixel driving circuit islands and the main display region, part of the metal reflective portion is disposed between the pixel driving circuit islands and the light-transmitting display region, and part of the metal reflective portion is disposed between two adjacent pixel driving circuit islands.

9. The display device according to claim 1, wherein a boundary of the metal reflective portion adjacent to the light-transmitting display region comprises an arc-shaped boundary, and a boundary of the metal reflective portion adjacent to the main display region comprises a staged boundary.

10. The display device according to claim 1, wherein the metal reflective portion transmits a direct current (DC) voltage signal, and the DC voltage signal comprises one of an initialization signal or a power signal.

11. The display device according to claim 10, wherein the DC voltage signal is a power signal input to the first pixel driving circuits and/or the second pixel driving circuits.

12. The display device according to claim 1, further comprising metal grids, wherein the metal grids are disposed in a same layer as the metal reflective portion and are connected with the metal reflective portion, part of the metal grids is arranged corresponding to the second pixel driving circuits, part of the metal grids is disposed in the main display region, and the metal grids are configured to transmit a direct current (DC) power signal.

13. The display device according to claim 1, wherein a proportion of an orthographic projection of metal in the metal reflective portion on a substrate of the display device in a unit area is A1, a proportion of an orthographic projection of metal in the first pixel driving circuits on the substrate of the display device in a unit area is A2, and an absolute value of a difference between A1 and A2 is greater than or equal to 0% and less than or equal to 6%.

14. The display device according to claim 1, wherein the first display pixels and the second display pixels comprise a plurality of organic light-emitting diodes, the metal reflective portion is disposed in a same layer as anodes of the organic light-emitting diodes, the metal reflective portion is insulated from the anodes of the organic light-emitting diodes, and a distance between the metal reflective portion and the anodes of the organic light-emitting diodes is greater than or equal to 3 microns.

15. The display device according to claim 1, wherein material of the metal reflective portion comprises at least one of molybdenum, aluminum, titanium, or copper.

16. An electronic equipment, comprising the display device according to claim 1 and an image sensor, wherein the image sensor corresponds to the light-transmitting display region of the display device.

* * * * *